(12) United States Patent
Aliyev et al.

(10) Patent No.: US 10,191,116 B2
(45) Date of Patent: Jan. 29, 2019

(54) BATTERY TEST SYSTEM FOR PREDICTING BATTERY TEST RESULTS

(71) Applicant: Johnson Controls Technology Company, Holland, MI (US)

(72) Inventors: Timur L. Aliyev, Chicago, IL (US); Zhihong H. Jin, Pewaukee, WI (US); Diego Hernan Diaz Martinez, Tallahassee, FL (US)

(73) Assignee: Johnson Controls Technology Company, Auburn Hills, MI (US)

( * ) Notice: Subject to any disclaimer, the term of this patent is extended or adjusted under 35 U.S.C. 154(b) by 302 days.

(21) Appl. No.: 14/884,585

(22) Filed: Oct. 15, 2015

(65) Prior Publication Data

US 2017/0108551 A1    Apr. 20, 2017

(51) Int. Cl.
*G01R 31/36* (2006.01)
*G06K 9/00* (2006.01)
*G06K 9/62* (2006.01)

(52) U.S. Cl.
CPC ..... *G01R 31/3651* (2013.01); *G01R 31/3627* (2013.01); *G01R 31/3641* (2013.01);
(Continued)

(58) Field of Classification Search
CPC ............ G01R 31/3651; G01R 31/3679; G01R 31/3641; G01R 31/3627; G06K 9/00536
See application file for complete search history.

(56) References Cited

U.S. PATENT DOCUMENTS 7,197,487 B2    3/2007 Hansen et al.
8,855,954 B1    10/2014 Bickford
(Continued)

FOREIGN PATENT DOCUMENTS

CN    103399276 A    11/2013
CN    104182630 A    12/2014
DE    1020130189405    5/2015

OTHER PUBLICATIONS

Anton et al., Battery state-of-charge estimator using the SVM technique, 2013, p. 6244-6253.* Huang et al. Support vector machine based estimation of remaining useful life: current research status and future trends, 2014.*
Rosenvinge et al., Lifetime Analysis of Automotive Batteries using Random Forests and Cox Regression, 2013.*
(Continued)

*Primary Examiner* — John Breene
*Assistant Examiner* — Mohammad Islam
(74) *Attorney, Agent, or Firm* — Fletcher Yoder P.C.

(57) ABSTRACT

A method of predicting battery test results includes using a battery test computer to predict a battery test result for a battery undergoing testing. The battery test computer comprises a tangible, non-transitory computer-readable medium storing a battery test management system implemented as one or more sets of instructions. The battery test management system includes a predictive module configured to predict the battery test result using less than all data required for the battery test to be complete, a validation module configured to validate the prediction, and a training module configured to re-train the predictive module based on results generated by the validation module. The battery test computer also includes processing circuitry configured to execute the one or more sets of instructions, and outputting, via a user interface, the prediction of the result and a confidence level associated with the prediction.

17 Claims, 8 Drawing Sheets

(52) U.S. Cl.
CPC ..... *G01R 31/3679* (2013.01); *G06K 9/00536* (2013.01); *G06K 9/6269* (2013.01)

(56) References Cited

U.S. PATENT DOCUMENTS

| | | | |
|---|---|---|---|
| 8,972,213 | B2 | 3/2015 | Zhang et al. |
| 2004/0034612 | A1* | 2/2004 | Mathewson ........... G06Q 10/06 706/46 |
| 2009/0210179 | A1* | 8/2009 | Tang ..................... H01M 10/48 702/63 |
| 2010/0312733 | A1 | 12/2010 | Song |
| 2012/0116722 | A1 | 5/2012 | Yousfi-Steiner et al. |
| 2013/0090900 | A1* | 4/2013 | Gering ............... G01R 31/3651 703/2 |
| 2015/0351037 | A1* | 12/2015 | Brown .............. H04W 52/0261 455/574 |
| 2016/0161567 | A1* | 6/2016 | Park ................... G01R 31/3679 702/63 |
| 2016/0231385 | A1* | 8/2016 | Bulur ................. G01R 31/3606 |

OTHER PUBLICATIONS

Guocheng Niu et al, Method of estimating the state of charge of a battery electric vehicle based on RS-SVM, Apr. 2015, International Conference on Automation, Mechanical Control and Computational Engineering (AMCCE 2015), College of Electrical and Information Engineering Beihua University, Jilin, 132021,China, 6 pgs.

Agarwal, V. et al, Development and Validation of a Battery Model Useful for Discharging and Charging Power Control and Lifetime Estimation, Energy Conversion, IEEE Transactions on (vol. 25, Issue:3), Sep. 2010, IEEE, West Lafayette, IN, US, 1 pg.

Jingliang Zhang et al., "A Review on Prognostics and Health Monitoring of Li-ion Battery", vol. 196, No. 15, pp. 6007-6014, Mar. 31, 2011.

PCT/US2016/018462 International Search Report and Written Opinion dated Jul. 21, 2016.

Weston, J. et al.; "Feature Selection for SVMs". In Proceedings of the Conference on Advances in Neural Information Processing Systems (NIPS). 2000. 7 pages.

Wang, Shuai et al.; "Prognostics of Lithium-Ion Batteries Based on Battery Performance Analysis and Flexible Support Vector Regression", Energies, 2014, pp. 6492-6508, vol. 7. 17 pages.

* cited by examiner

BATTERY TEST SYSTEM FOR PREDICTING BATTERY TEST RESULTS

BACKGROUND

The present disclosure relates generally to the field of batteries. More specifically, the present disclosure relates to systems and methods for battery testing.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

Batteries, including batteries having one or more individual electrochemical cells, are currently used in a wide variety of applications, including energy storage in homes, electronics, and a wide variety of vehicles. Indeed, batteries are ubiquitous in the vehicle industry, and are used in vehicles for a variety of reasons, including capturing and storing energy for powering various vehicle processes. For example, batteries may be used for starting an internal combustion engine, for powering an air conditioning unit and various electronics in the vehicle, and so forth.

The most common types of batteries used in vehicles include lead-acid batteries and lithium-ion batteries. Historically, lead-acid batteries are the most common type used in vehicles, and are subject to a number of different standards including standards for size, shape, and power ratings (e.g., charge and discharge capacity, voltage). These standards are in place, for example, to increase consumer confidence and to ensure compliance with various regulatory requirements. As one example, lead-acid batteries, which may be used for starting, lighting, and ignition (SLI) automotive applications, may be subject to various standards relating to their ability to support such applications for a certain period of time. Accordingly, various standardized tests (tests performed under standardized conditions and having standardized results) have been established to rate batteries for particular applications.

As may be appreciated, it is desirable for batteries produced for a particular application or set of applications to pass standardized tests associated with such applications. Thus, manufacturers may perform periodic testing on samples obtained from different manufacturing lines to ensure quality. In addition, manufacturers may subject prototype battery samples to various standardized tests to identify whether new designs are appropriate for their intended use.

Standardized tests, particularly those in the automotive industry, can last for weeks, even months, until a final result is obtained for a particular battery. This is due, at least in part, to the desirability for automotive batteries to remain useful for a certain amount of time (e.g., to have a long lifetime). The standardized tests associated with these determinations may therefore require extended periods of time to provide an accurate measure of the suitability for a particular battery to last a predetermined amount of time. Some tests may measure, for example, whether a battery retains its ability to be charged and discharged by a predetermined amount after a specified period of time under high stress. Such tests may result in a "pass" or "fail" of the test.

Unfortunately, the length of time required for results to be obtained leads to a lack of advance warning that certain manufacturing designs or processes may need attention. It is now recognized that it may therefore be desirable to reduce the amount of time associated with battery testing. It is also now recognized that it may be desirable to predict test outcomes to provide rapid feedback for battery design and manufacturing.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

One aspect of the present disclosure relates to a battery testing system, including a battery test computer having a tangible, non-transitory computer-readable medium storing a battery test management system implemented as one or more sets of instructions. The battery test management system includes a prediction module, a validation module, and a training module. The battery test computer also includes processing circuitry configured to execute the one or more sets of instructions. The system also includes a user interface communicatively coupled to the processing circuitry and configured to provide outputs to a user. The prediction module is configured predict a result of a standardized battery test conducted on a battery using less than all data required for the standardized battery test conducted on the battery to be completed, and to output, via the user interface, the predicted result and a confidence level associated with the predicted result. The validation module is configured to determine a validity of the predicted result using final test results from the standardized battery test conducted on the battery, and to output, via the user interface, a representation of the validity. The training module is configured to update training data using the validity generated by the validation module to update the prediction module.

Another aspect of the present disclosure relates to a tangible, non-transitory computer-readable medium storing a battery test management system implemented as one or more sets of instructions, wherein the battery test management system includes a prediction module, a validation module, and a training module that, when executed by a processor, are configured to: generate a prediction of a result of a standardized battery test conducted on a battery using less than all data required for the standardized battery test conducted on the battery to be completed, and to output, via the user interface, the prediction of the result and a confidence level associated with the prediction of the result; determine a validity of the prediction of the result using final test results from the standardized battery test conducted on the battery, and to output, via the user interface, a representation of the validity; and update training data based on the determined validity to update the prediction module.

A further aspect of the present disclosure relates to a method of predicting battery test results includes using a battery test computer to predict a battery test result for a battery undergoing testing. The battery test computer comprises a tangible, non-transitory computer-readable medium storing a battery test management system implemented as one or more sets of instructions. The battery test management system includes a predictive module configured to predict the battery test result using less than all data required for the battery test to be complete, a validation module configured to validate the prediction, and a training module configured to re-train the predictive module based on results generated by the validation module. The battery test computer also includes processing circuitry configured to execute the one or more sets of instructions, and outputting, via a user interface, the prediction of the result and a confidence level associated with the prediction.

DRAWINGS

Various aspects of this disclosure may be better understood upon reading the following detailed description and upon reference to the drawings in which.

Figure 2:
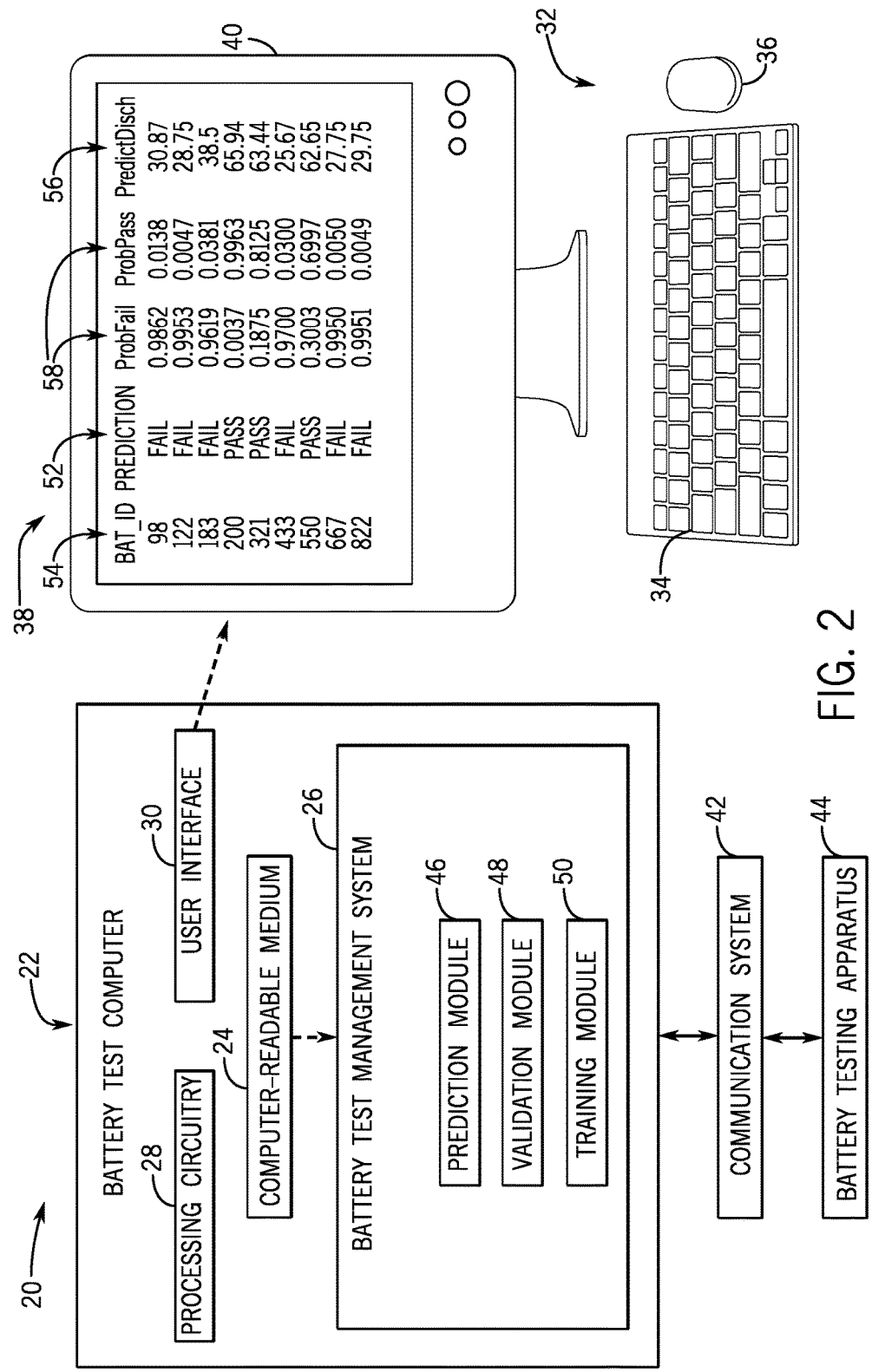
FIG. 2 is a diagram illustrating an embodiment of a battery test system having a battery test computer with a computer-readable medium storing instructions for predicting battery test results, in accordance with an aspect of the present disclosure.
Figure 5:
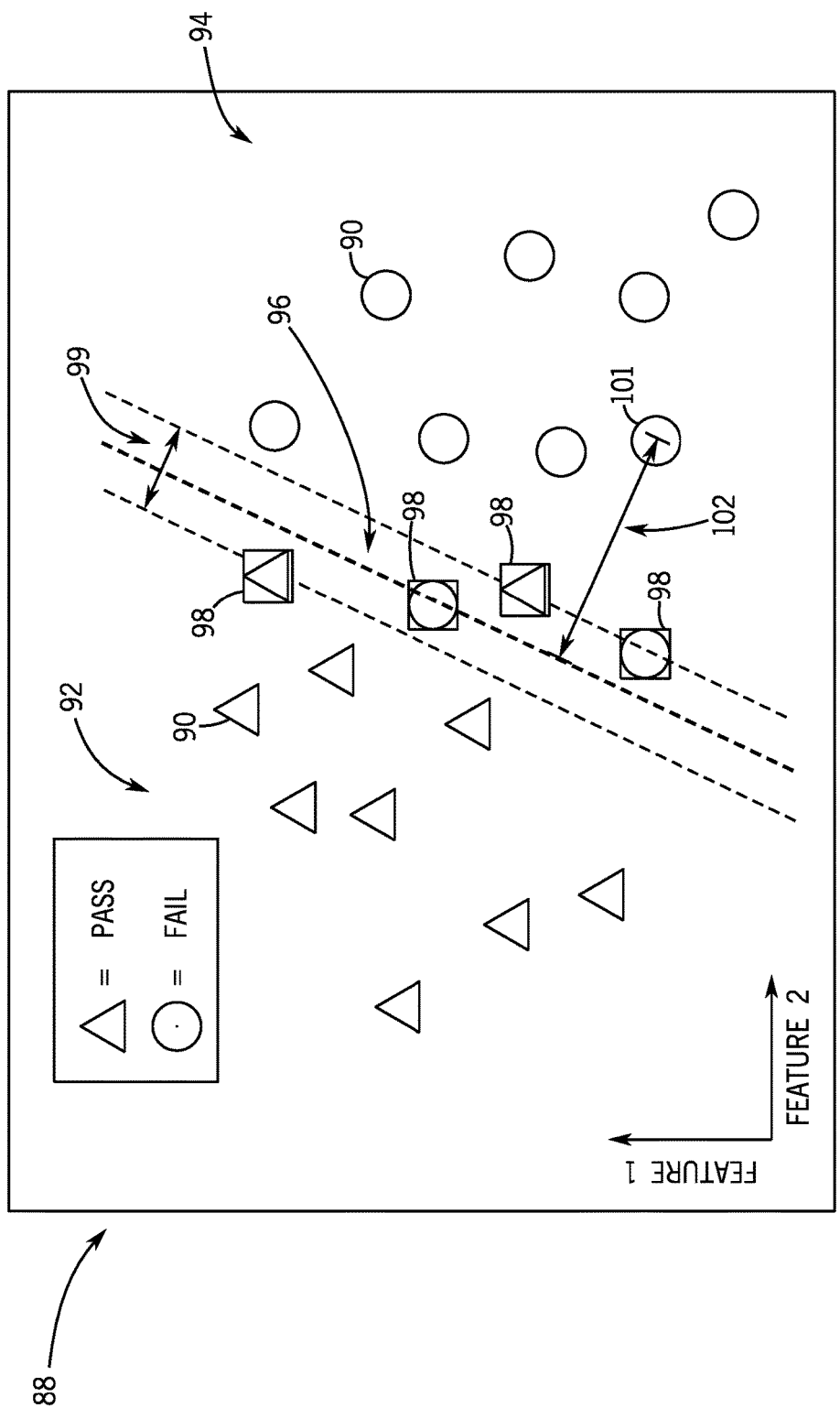
FIG. 5 is an example representation of a plot constructed by a support vector machine (SVM) in which data elements obtained from historical battery test data are separated into two classes separated by a calculated hyperplane, in accordance with an aspect of the present disclosure.
Figure 7:
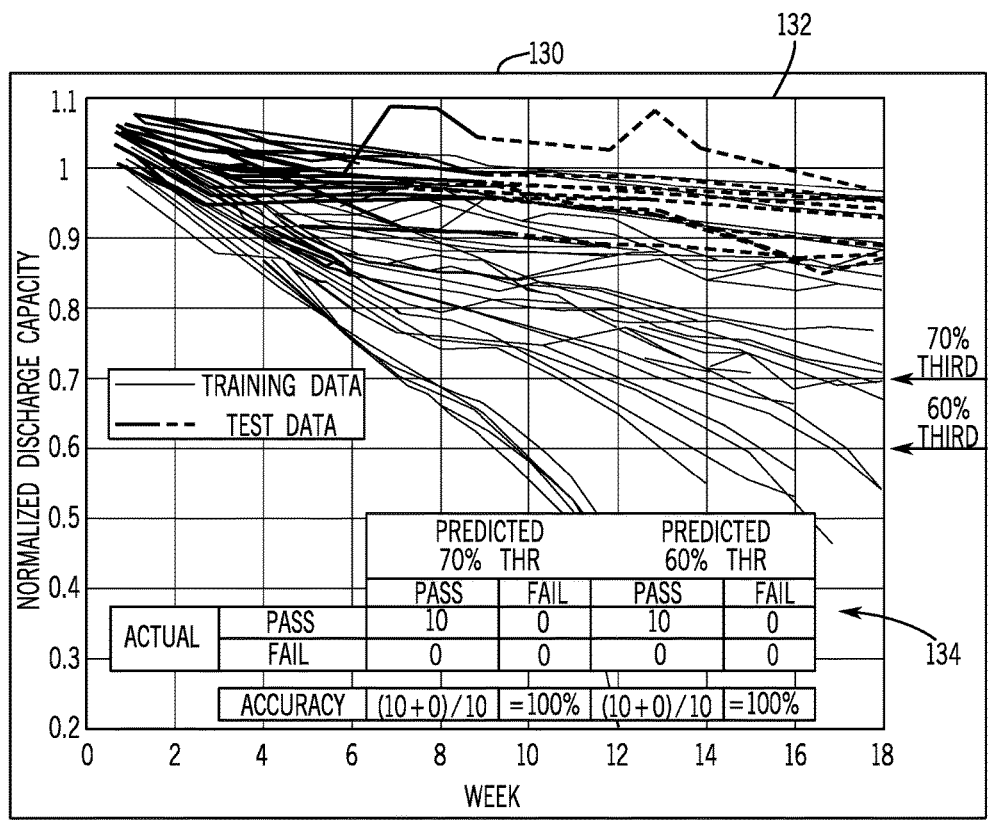
Figure 8:
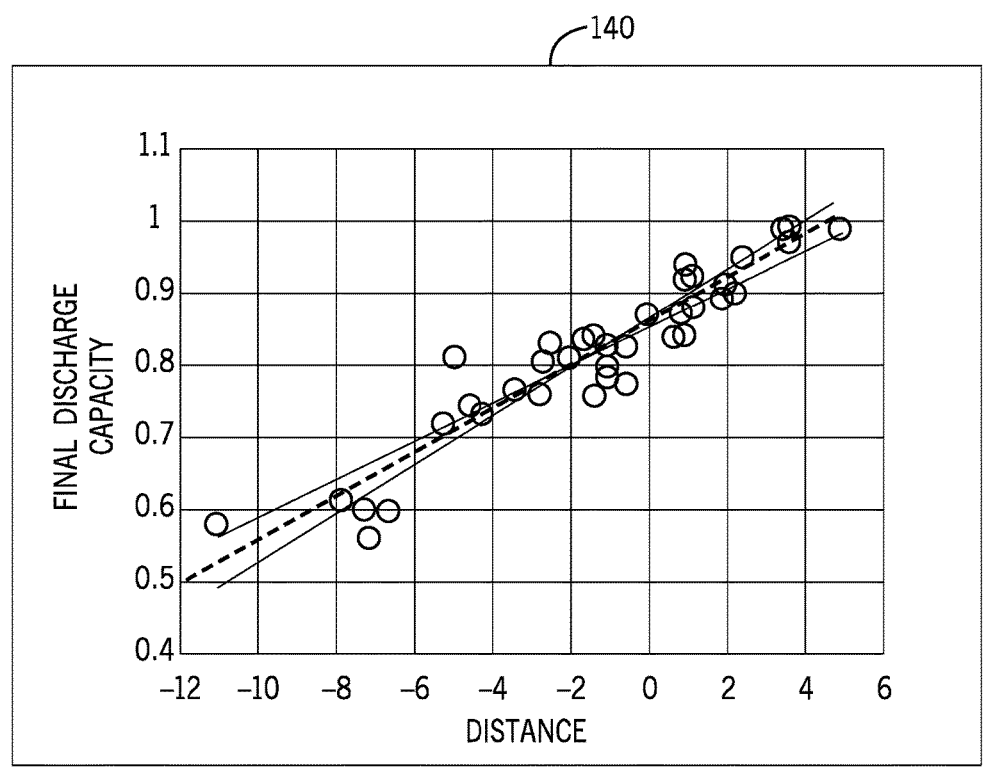

FIG. 7 is an example output generated by the battery test computer of FIG. 2 and including test results, test predictions, and a truth table depicting the accuracy of the predictions, in accordance with an embodiment of the present disclosure; and FIG. 8 is a plot of final discharge capacity as a function of distance of a data point from the hyperplane of FIG. 5 as obtained by linear regression, in accordance with an aspect of the present disclosure.

DETAILED DESCRIPTION

One or more specific embodiments of the present techniques will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As set forth above, certain standardized battery tests may take weeks or even months to complete for a single battery. For example, certain types of standardized battery tests may function to simulate normal operational conditions over a long period of time (e.g., years), such as would be experienced during the average lifetime of a battery used in a motor vehicle. The standardized battery tests may, for example, subject a particular battery to operational stresses over a certain period of time. If the particular battery does not maintain a certain level of performance after this time, then the battery may be considered to fail the test. On the other hand, the battery may be considered to pass the test if the battery maintains a certain level of performance after the time period has completed.

Standardized tests for batteries, such as automotive batteries, may be performed on certain batteries out of a group for quality control, or for advanced feedback in certain battery design processes. For instance, during the design phase of developing a battery, a battery sample representative of a certain group (e.g., a certain design) may be subjected to one or more standardized battery tests to determine whether the design is feasible in the real world. Thus, the tests may provide important feedback for certain engineering and design considerations, as well as feedback regarding whether a manufacturing process is operating as expected (e.g., for quality control). Unfortunately, during the time in which these tests are performed, the ultimate result of each test may be unknown, meaning that feedback for engineering and manufacturing processes may be delayed. In addition, such time-consuming delays are usually unavoidable, as certain batteries, such as automotive batteries, may be subject to stringent compliance rules set forth by regulatory authorities in which battery designs must be certified according to these tests.

In accordance with certain aspects of the present disclosure, it is now recognized that it may be desirable to predict the outcome of certain standardized battery tests before the tests are completed. For example, even though such standardized tests must be passed by battery designs that are ultimately introduced into the market, it is now recognized that a predicted outcome of such a test may be useful in providing advanced feedback so that adjustments may be made to a battery design and/or a battery manufacturing process. In one aspect of the present disclosure, the disclosed embodiments may enable early prediction of battery life test results (that last for weeks), such as the AK3.4 standardized battery life test, based on partial test data. Such tests are typically performed on lead-acid batteries (e.g., absorbed glass mat (AGM) batteries) used for automotive purposes, but the present disclosure is intended to be applicable to other energy storage devices (e.g., secondary batteries) subject to various standardized testing methods, such as lithium ion batteries, ultracapacitors, and so forth.

It is now recognized that accurate results of early prediction enable advantages in engineering design, concept validation, and may help save labor costs and/or increase the number of tested batteries if the test does not have to be completed based on the early prediction. The present disclosure provides, among other things, example embodiments of the manner in which this prediction and adjustment to manufacturing and/or design processes may be accomplished. However, the disclosed embodiments of prediction may have other uses and may solve other technical problems.

Figure 1:
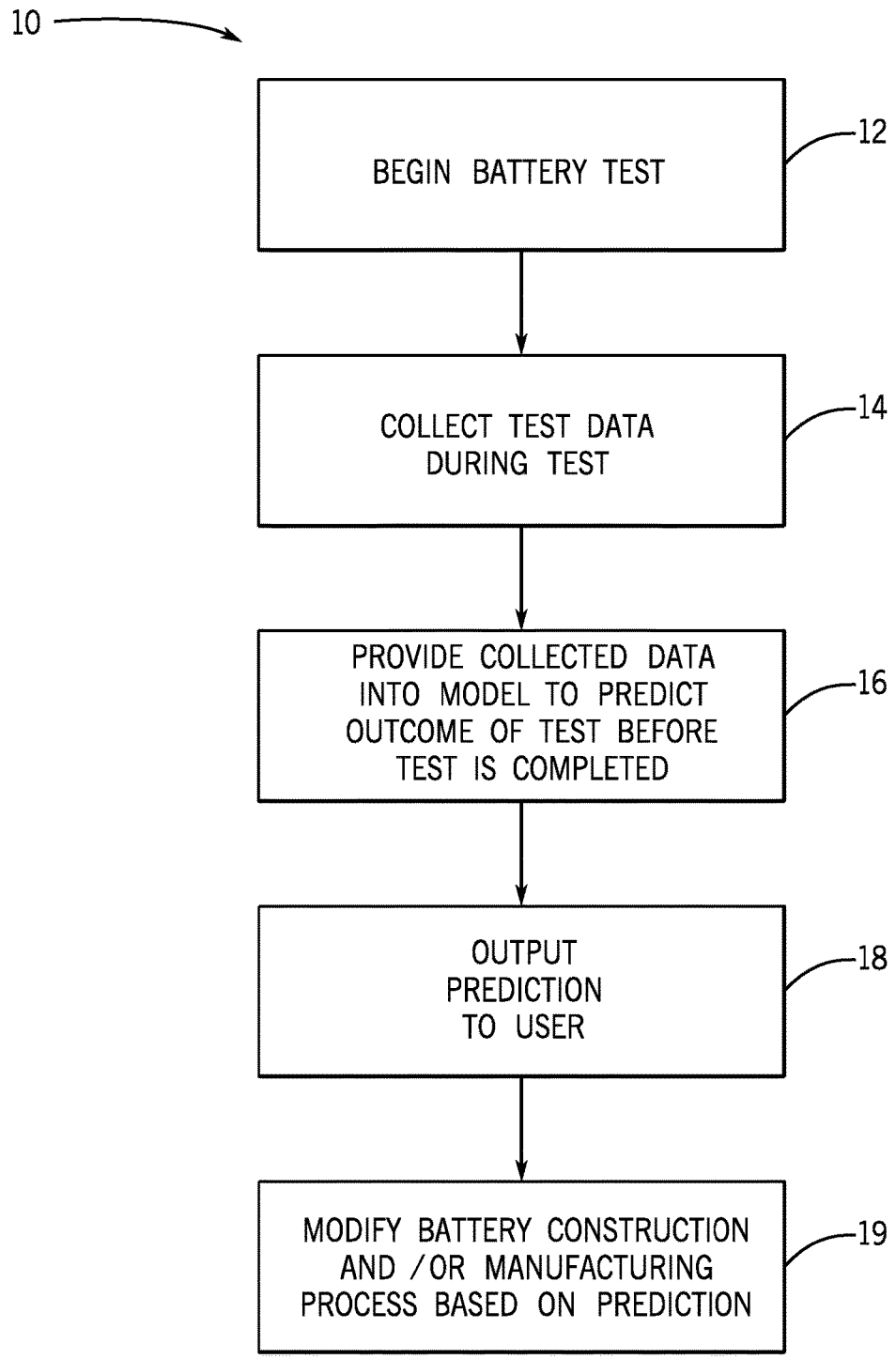
FIG. 1 is a process flow diagram illustrating an embodiment of a method for predicting the outcome of a battery test based on a constructed model using partial test data, in accordance with an aspect of the present disclosure.

To help illustrate, FIG. 1 is a flow chart illustrating an embodiment of a method 10 for predicting the outcome of a battery test in accordance with an aspect of the present disclosure. As illustrated, the method 10 includes beginning the battery test (block 12). Beginning the battery test in accordance with the acts represented by block 12 may include, for example, connecting the battery to be tested to a testing apparatus, examples of which are described in further detail below with respect to FIG. 2. The testing apparatus may include a user interface, which a user may manipulate to initiate testing of the battery using the testing apparatus. As one example, the testing apparatus may include one or more switches that a user may throw to initiate the test. As another example, the testing apparatus may include a computer interface and associated software that a user may interact with to initiate testing.

The illustrated method 10 also includes collecting (block 14) test data during the test. As noted above, the test may run for a particular time period, such as a number of weeks. In some situations, the test may involve comparing data collected at the beginning of the testing period with data collected at the end of the testing period. Accordingly, data collected throughout the test may typically be discarded or not used for any particular purpose. However, in accordance with present embodiments, the data collected during the test, such as at various time points throughout the test, may be used as an input to battery test management systems described herein for the purpose of predicting an outcome of the test.

Thus, in accordance with present embodiments, the illustrated method 10 may include providing (block 16) the collected data into a prediction module of the battery test system to predict the outcome of the test before the test is completed. For example, the acts represented by block 16 may include receiving, at a battery test computer, test data from a local or remote testing location. The local testing location may include test equipment that is communicatively coupled to the battery test computer via, for example, a wireless network or physical wiring. Additionally or alternatively, the remote testing location may be communicatively coupled to the battery test system via a wireless network, via the Internet, or any other similar connection.

In certain embodiments, the battery test system may output (block 18) the prediction to a user (e.g., via a user interface). For example, the battery test system may include an audio and/or visual system capable of outputting a user-perceivable indication relating to the prediction. As an example, the battery test system may include a display that receives instructions from processing circuitry of the battery test computer to visually present a predicted result of the test, and/or predicted values for battery properties at certain times during the test, and at the end of the test. As described in further detail below, the prediction may also be provided in combination with other measures relating to the prediction, such as a confidence in the prediction based on statistical correlations. As one example, the predicted outcome may be whether the battery will pass or fail the test. As another example, the predicted outcome may be a value of a particular parameter, such as a predicted discharge capacity that the battery will have at the end of the test period.

In certain embodiments, the predicted outputs from the acts represented by block 18 may be useful feedback from a design standpoint for early diagnosis and correction of engineering and/or battery manufacturing issues. Accordingly, the method 10 may include modifying (block 19) engineering design and/or manufacturing processes associated with the batteries of the type for which the predictions were made. This may improve the overall operation of battery engineering processes and may also improve the operation of manufacturing facilities, for example by providing early feedback for quality control. For instance, batteries that were predicted to fail certain tests or aspects of tests may each have a particular battery identifier, which can then be traced back to certain battery designs, or certain manufacturing facilities for possible improvement thereof.

An example of the manner in which present embodiments, such as method 10 of FIG. 1, may be implemented using special purpose computers and other hardware components may be further appreciated with respect to FIG. 2, which schematically depicts an embodiment of a battery test system 20 in accordance with present embodiments. In the illustrated embodiment, the battery test system 20 includes a battery test computer 22, which includes a tangible, non-transitory computer-readable medium 24 (e.g., memory circuitry) storing a battery test management system 26 implemented as one or more sets of instructions (e.g., processor-executable instructions). The battery test computer 22 also includes one or more processor 28 configured to execute the instructions associated with the battery test management system 26 to perform certain routines to predict battery test outcomes, among other functions.

More specifically, the one or more processor 28 may include one or more application specific integrated circuits (ASICs), one or more field programmable gate arrays (FPGAs), one or more general purpose processors, or any combination thereof. Additionally, the memory circuitry 24 may include volatile memory, such as random access memory (RAM), and/or non-volatile memory, such as read-only memory (ROM), optical drives, hard disc drives, or solid-state drives. In some embodiments, described in further detail below, the battery test computer may include portions of a vehicle control unit (VCU), a battery control module, or other feature used within a vehicle.

The battery test computer 22 may also include a user interface system 30, which may include one or more devices communicatively coupled to the memory 24 and processor 28 to enable a user to provide input to the battery test computer 22 and to enable the battery test computer 22 to provide outputs to the user. The user interface system 30 may include one or more user input devices 32 may include, but are not limited to, a keyboard 34, a mouse 36, a trackball, touchscreen, keypad, a microphone, and so forth. The user input devices 32 may enable a user to manually enter data (e.g., battery test data), to generally control one or more aspects of the battery test management system 26 (e.g., initiate testing of a battery, initiate test outcome prediction, initiate validation, initiate training, review results, modify parameters of the prediction, validation, and/or training). The user interface system 30 may also include user output devices 38 configured to provide user-perceivable indications relating to the operation of the battery test computer 22, and more specifically to provide outputs to the user that relate to the prediction of battery test results. As illustrated, the user output devices 38 may include a display 40 configured to visually present information to a user (e.g., battery test predictions, battery test data). The user output devices 38 may, additionally or alternatively, include one or more acoustic devices (e.g., speakers) configured to provide user-audible outputs relating to these aspects.

The battery test computer 22 may also include a communication system 42 that enables communication with other devices, such as a battery testing apparatus 44 configured to physically couple to a battery for testing. For example, the battery testing apparatus 44 may include voltage sensors, current sensors, a load circuit or load connectors, interface features configured to enable test data to be provided to other devices and/or users, and so forth.

Other devices that may be communicatively coupled to the battery test computer 22 via the communication system 42 may include portable electronic devices of a user, vehicle control systems, vehicle diagnostic systems, as well as systems (e.g., battery testing systems) located remotely from the battery test computer 22. To enable such communications, the communication system 42 may include a variety of hardware devices and, in some embodiments, associated code (e.g., drivers) stored on the memory circuitry 24 to enable the processor 28 to process inputs received at the communication system 42. Example hardware devices of the communication system 42 may include wireless transmission and receiving equipment (e.g., transceivers), general purpose ports (e.g., ports for networking connectors), special purpose ports (e.g., ports for battery test equipment), and so forth. In the illustrated embodiment, for example, the battery testing apparatus 44 may provide battery test data to the battery test computer 22 via the communication system 42. The processor 28 may then use the battery test data as an input to the battery test management system 26, as described in further detail below.

As illustrated, the battery test management system 26 may include certain sets of instructions that, when executed by the one or more processor 28, are configured to predict battery test outcomes based at least on battery test data obtained during a battery test, to validate the predictions, and to update and/or re-train portions of the battery test management system that carry out the predictions. In accordance with present embodiments, the battery test management system 26 may include a prediction module 46, a validation module 48, and a training module 50, which may all be implemented as sets of instructions stored on the memory circuitry 24. In a general sense, the prediction module 46 is configured to generate a predicted outcome for a battery test using battery test data obtained before the test is completed, the validation module 48 is configured to determine a validity of the predicted outcome generated by the prediction module 46, and the training module 50 is configured to update training data using results generated by the validation module 48 to update the prediction module 46.

Though they are illustrated and described as individual portions of the battery test management system 26, the prediction module 46, the validation module 48, and the training module 50 are illustrated and described in this manner to provide a functional representation of the battery test management system 26. That is, the prediction module 46, the validation module 48, and the training module 50 are functionally described as individual components, but in an actual implementation, some or all of the instructions associated with these functions may be tightly integrated with other functions performed by the other portions of the battery test management system 26. Accordingly, the battery test management system 26 and its features are presented from a structural-functional point of view, where the functions described herein are intended to denote one or more instructions physically stored on the memory circuitry 24 that, when executed by the one or more processor 28, perform the described functions.

The present disclosure is intended to encompass various implementations of the battery test management system 26. Generally, the battery test management system 26 may be a group of processor-executable instructions produced in any appropriate programming platform, such as C++, Matlab, and so forth. The battery test management system 26 may be constructed, in some embodiments, to automatically run some or all routines associated with prediction of test outcomes, such as to automatically generate predicted battery parameters, automatically run validation, re-training and/or updating, and so forth. In one particular embodiment, at least a portion of the battery test management system 26 may be implemented as a specially-configured battery test support vector machine (SVM) that has been trained using certain types of battery test data. Further details regarding the manner in which the battery test management system 26 may operate and may be constructed are provided below.

As described herein, the prediction module 46 of the battery test management system 26 may include one or more statistical models constructed from historical battery test data obtained from battery tests performed on a number of battery samples. The historical battery test data may be data that spans an entire test duration for each battery sample. For example, if a standardized battery test lasts a predetermined number of weeks, then the historical battery test data will include the data spanning the entire predetermined number of weeks for each battery sample. As an example, one or more of the statistical models may be a predictive classifier model (e.g., a predictive linear classifier) that predicts, based on an incomplete set of data (e.g., data from less than the full duration of a test), whether a battery will pass or fail the test. One or more of the statistical models may, additionally or alternatively, predict the characteristics that the battery undergoing testing will have at the end of the test duration. As one example, the statistical model may predict, at a time before the end of the test, a discharge capacity value that the battery will have at the end of the test duration. In one embodiment, one or more of the statistical models may use linear regression as described in more detail below.

An example of various outputs that the battery test management system 26 may provide is shown on the display 40. As illustrated, a plurality of predicted results are provided, including a pass or fail prediction 52 associated with a battery identifier 54, each battery identifier 54 being associated with one particular battery. In this regard, the memory circuitry 24 may store historical predictions and may store multiple predictions as they are output by the battery test management system 26 for access by a user, for example to allow comparisons between batteries. As shown, the stored data may be tabulated, sorted, and prepared for presentation to the user. A predicted discharge capacity 56 is also provided for each battery identifier 54, but other predicted values may be provided as noted above.

In addition to outputting predicted battery characteristics and test results, the battery management system 26 may also output an indication 58 of the confidence of the predictions. In FIG. 2, the indication 58 is shown as a probability of the particular battery passing the test and a probability of the particular battery failing the test. However, in some embodiments the indication 58 may only include one of these.

The battery test management system 26, when executed by the one or more processor 28, may be configured to automatically perform various tasks associated with the prediction module 46, the validation module 48, and/or the training module 50. For example, the battery test management system 26 may automatically perform the general functions of each module as noted above, or may not perform all or a portion of these functions based on certain user inputs (e.g., whether or not to continue learning from further test data).

Figure 3:
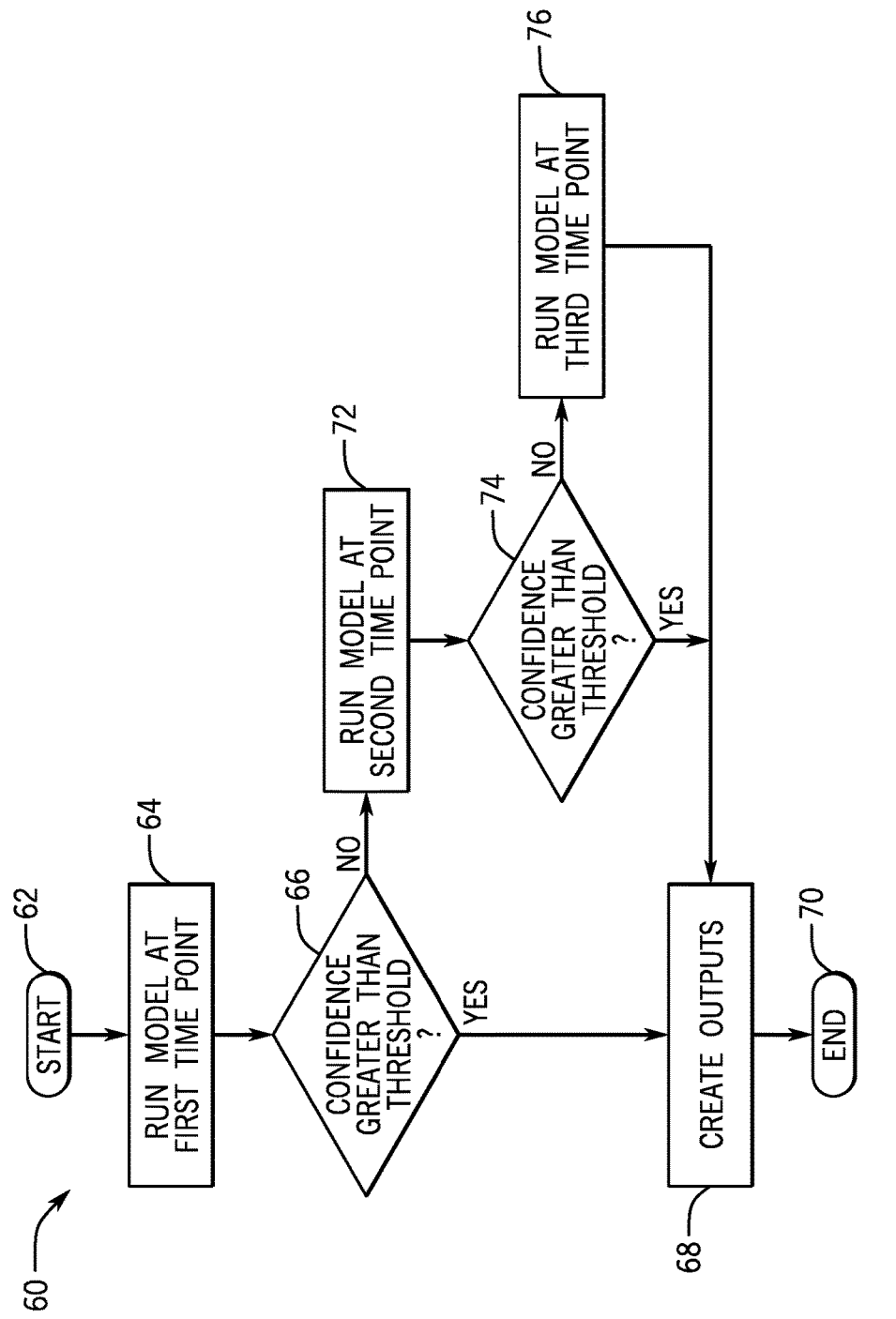
FIG. 3 is a process flow diagram illustrating an embodiment of a process for predicting battery test results using a constructed model, in accordance with an aspect of the present disclosure.

FIG. 3 depicts an embodiment of a method 60 performed by the battery test computer 22 during execution of instructions associated with the battery test management system 26. More specifically, the method 60 may be considered to represent an automated routine performed by the battery test computer 22 to predict an outcome, for a particular battery, of a battery test in conjunction with the performance of the battery test (e.g., a standardized battery test) on the particular battery. In accordance with certain embodiments, the method 60 is performed without interruption to the battery test.

As depicted in the process flow of FIG. 3, the battery test management system 26 may receive an instruction from the battery test computer 22 (e.g., via a user input) to initiate the battery test prediction process (block 62). As an example, the initiation in accordance with the acts represented by block 62 may be performed at substantially the same time as initiation of a battery test performed on a battery. As one example, a user may initiate testing of a battery in accordance with a battery testing standard, and the battery test management system 26 may automatically initiate data collection and storage of the battery test data as the test progresses.

As illustrated, at a first time point after initiation of the testing procedure, instructions associated with the prediction module 46 (e.g., a statistical model) may be run (block 64), using the battery test data collected from the initiation time to the first time point as a predictive input. As a specific example, the first time point may be 4 weeks after test initiation (thus, the model run in accordance with block 64 may use 4 weeks of test data collected from the battery sample). However, the first time point may generally be any time before the full time period of the test. As may be appreciated, the first time point may be a time where sufficient data has been collected to enable an accurate prediction, but not so late so as to reduce the value of performing the prediction.

The prediction module 46 may output a predicted test result or a predicted battery characteristic (e.g., final discharge capacity), as well as a confidence factor associated with the prediction. The output may be provided to the user, or may simply be an output for further processing via the battery test management system 26 and the hardware of the battery test computer 22.

To determine whether the method 60 should be completed or should be continued, the battery test computer 22 may perform a first determination (query 66) regarding whether a confidence factor associated with the predicted outcome generated in accordance with the acts represented by block 64 is above a predetermined threshold. In situations where the confidence factor is above the threshold, the method 60 proceeds to outputting (block 68) the generated prediction to the user. For example, the outputting in accordance with the acts represented by block 68 may include outputting a predicted test result, predicted battery characteristics, associated confidence factors, and so forth, via one or more of the user output devices 38.

Upon outputting user-perceivable results in accordance with the acts represented by block 68, the method 60 proceeds to termination (block 70) of the prediction process. The acts represented by block 70 may include automatically terminating the prediction process upon outputting the prediction having a confidence factor above the predetermined threshold, or may include prompting the user to provide an input to the battery test computer 22 regarding whether the user wishes to continue the prediction process (e.g., to continue the prediction for another length of time to further increase the confidence of the prediction), or terminate the process. Indeed, this type of prompt may be provided to the user at any one or a combination of time points when the battery test management system 26 generates a predicted outcome, predicted characteristics, confidence factor, and so forth.

Further, in certain embodiments, the acts represented by block 70 may include providing a prompt to the user for an input regarding whether to terminate the actual test being conducted on the battery sample. For example, in embodiments where the predicted outcome is that the battery will fail the battery test, the battery test computer 22 may provide a notification to the user and follow this notification with a prompt regarding whether the test is to be continued or whether the test is to be completed. In embodiments where the user provides an input that the test should be terminated, the battery test computer 22 may communicate with the battery test apparatus 44 via the communication system 42 to terminate the testing procedure. In other embodiments, the prompt provided to the user may be for input regarding whether to terminate the prediction process. In such embodiments, if the user wishes to terminate the prediction process, the battery test computer 22 may simply cease collecting data, or may continue collecting test data but may not necessarily continue to use this data as a predictive input. However, the battery test computer 22 may use this data as additional training and validation data.

Returning to query 66, in situations where the confidence factor does not exceed the predetermined confidence level threshold, the method 60 may proceed to running (block 72) the statistical prediction model (e.g., running the prediction module 48 including the statistical prediction model) at a second time point, where the second time point is after the first time point but is before the full duration of the test. In certain embodiments of the method 60, the second time point may be a factor of the first time point. By way of non-limiting example, the second time point may be 1.25 to 3 times the first time point. As a specific example, the first time point may be 4 weeks after test initiation (thus, the model run in accordance with block 64 may use 4 weeks of test data collected from the battery sample), and the second time point may be 6 weeks (the second time point in this example is a factor of 1.5 of the first time point).

As with the acts represented by block 64, the acts represented by block 72 may also include the generation of a prediction of the test outcome (a predictive output), battery characteristics, and a second confidence level associated with the updated predictions. To the extent that these predictions provide substantially the same type of information as the predictions generated at the first time point, the predictions generated at the second time point may be considered to be first updated predictive outputs, and may include any one or a combination of the types of outputs noted above that may be generated by the prediction module 46.

Upon generation of the first updated predictive outputs, the method 60 proceeds to query 74, where the battery test computer 22 determines whether the confidence factor associated with the first updated prediction is above a predetermined threshold. This threshold may be the same level used in query 66, or may be higher (e.g., requiring a higher confidence) because the prediction should have increased accuracy. The result of the acts represented by query 74 may be substantially the same as set forth above with respect to query 66, where if the confidence is sufficiently high (higher than the threshold), the method 60 proceeds to outputting the prediction to the user and termination in accordance with the acts represented by blocks 68 and 70. On the other hand, if the confidence factor is not above the threshold, the method 60 proceeds with further analysis.

Specifically, the method 60 proceeds to running (block 76) the statistical model at a third time point (e.g., a final time point), after the first and second time points but before the entire duration of the test. The third time point (a final time point in this example) may be any factor of the first time point and may have any suitable relationship to the second time point. While described as a final time point, this is intended to denote a final time point for prediction, and not a final time point for testing (i.e., not the entire test duration).

As one example, the entire test duration may be greater than 10 weeks (e.g., 16 or 18 weeks), the third time point may be 9 weeks, the second time point may be 6 weeks, and the first time point may be 4 weeks. At the third time point, the battery test management system 26 generates second updated predictive outputs in a similar manner as set forth above with respect to block 72. However, the second updated predictive outputs as shown may be provided in accordance with the acts represented by block 68.

As illustrated, after the third time point, no further queries are performed and the process may be terminated as set forth above with respect to the acts represented by block 70. The number of time points and associated predictions used by the method 60 is not limited to three times as illustrated. Rather, any suitable number of time points and associated predictions may be utilized. In some embodiments, the time points may occur at any specified frequency and interval between the beginning and end of a full test procedure.

In accordance with certain aspects of the present disclosure, it may be beneficial to significantly reduce the test duration by predicting the test results with high confidence before the completion of the test. As such, certain embodiments of the present disclosure may function to, among other things, build the statistical models used for prediction, train the statistical models using real data, and improve the accuracy of the predictions generated by re-training the statistical models as desired. As noted above, the prediction module 46 may, in some embodiments, include routines functioning as the statistical model described above, and which may be fully or partially implemented using a special-purpose battery test support vector machine (SVM) that is trained using specific parameters to produce particular types of outputs (e.g., predicted test outcomes).

Figure 4:
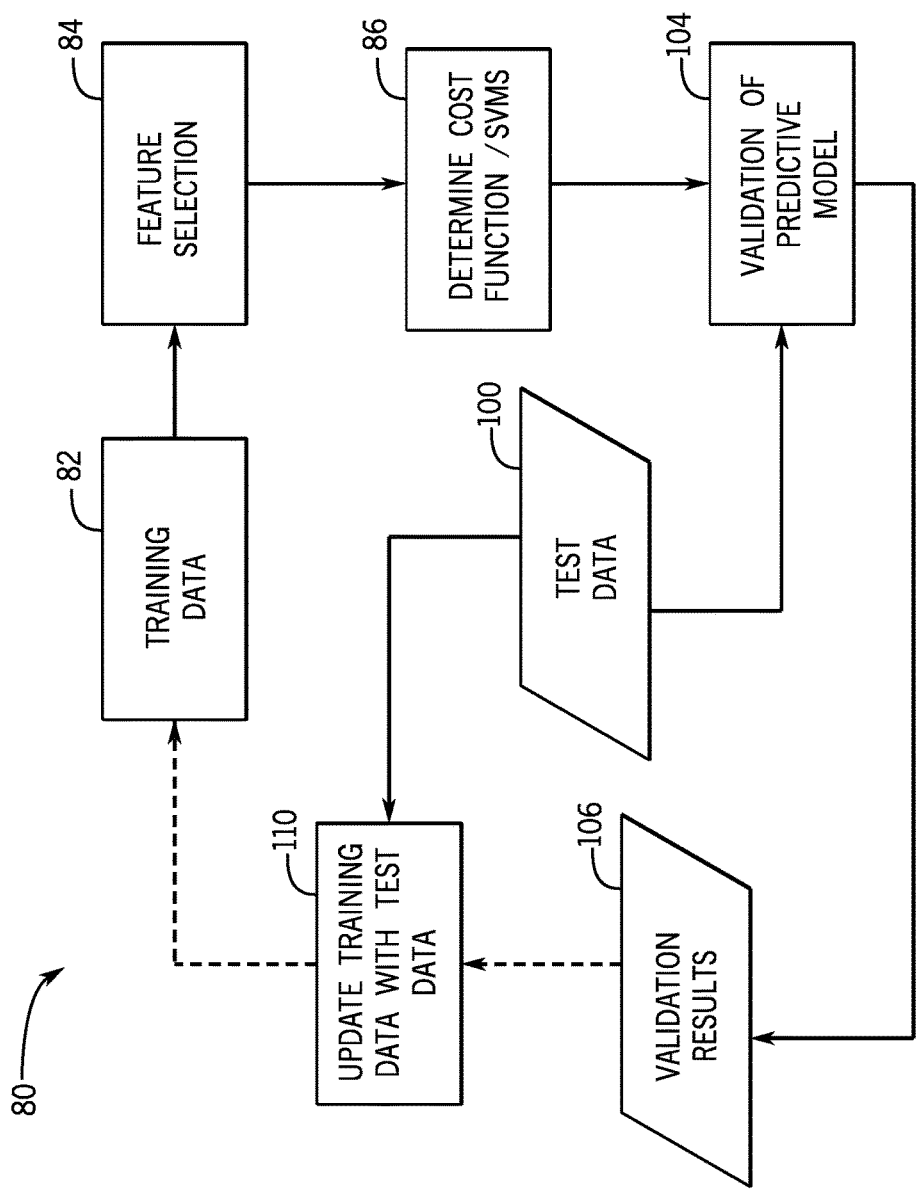
FIG. 4 is a process flow diagram illustrating an embodiment of a method for training and re-training a predictive model, in accordance with an aspect of the present disclosure.

FIG. 4 depicts an example embodiment of a method 80 for building, training, and updating a statistical model in accordance with an aspect of the present disclosure. In certain embodiments, the method 80 may be an automated algorithm programmed in any suitable programming platform, and may be implemented as processor-executable instructions stored on the memory circuitry 24. Accordingly, the method 80 may be one or more processes or applications run on the battery test computer 26.

The illustrated method 80 includes the use of training data 82 and a feature selection process (block 84) to generate one or more statistical models (e.g., battery test SVMs) along with a subset of features (e.g., battery characteristics) that serve as predictive inputs on which the statistical models may base predictions. The training data 82, as set forth above, may include full battery test data sets (data from an entire duration of a particular battery test, as well as the test results) obtained from historical runs of the test on a set of battery samples.

The illustrated feature selection process represented by block 84 may include performing an automated algorithm (e.g., a feature identification algorithm) that is configured to obtain combinations of features (e.g., particular battery characteristics) that enhance separation between different classifications of batteries (e.g., those that pass versus those that fail the battery test). In addition, the features obtained in accordance with block 84 may be used to produce statistical models that are stable, meaning the models are stable to battery samples that have outlying characteristics that would otherwise cause a significant decrease in prediction accuracy of the models.

The one or more algorithms to find such features may use certain raw battery test data, such as a discharge capacity of the battery and a charge capacity of the battery, and may normalize these values to enable battery test data from a plurality of different batteries to be used in construction of the models. The feature identification algorithm may also include performance of certain processing steps, such as averaging of the normalized charge and discharge capacities, calculation of the standard deviation of these values, and so forth. The automated algorithm, in some embodiments, may construct different features from normalized capacity curves. The algorithm may use normalized discharge capacity per week, normalized charge capacity per week to determine an efficiency per week (the discharge capacity divided by the charge capacity), and may use these weekly values to then generate function curves and rate of change curves. For different time windows (e.g., different week ranges), the algorithm may calculate averages and standard deviations of various rates of change, normalized capacity values, and so forth. Example features may include rate of change of charge capacity between certain time periods (e.g., between weeks 6 and 7 of a test that lasts 18 weeks), an average efficiency between certain time periods (e.g., between weeks 3 and 5), and a standard deviation of discharge capacity between certain time periods (e.g., weeks 6 and 9.)

The battery test SVM, for example, can be configured to predict the outcome of the present battery test using less than all data required for the standardized battery test to be completed as a predictive input, after the battery test SVM is trained. In one embodiment, training the SVM includes condensing thousands of data points into a manageable number of support vectors (SVs). After training, the specially-configured battery test SVM may predict the outcome of the battery test using test data collected prior to the completion of the full test duration. Additionally, all test results are fed into the predictive model such that the accuracy improves with each battery test conducted. Accordingly, the models set forth herein may continuously improve the operation of the battery test computer 22 by improving accuracy and enabling earlier prediction of accurate test results.

To help illustrate an example of the manner in which the model is constructed and used, FIGS. 4 and 5 are described in combination with one another below. Referring briefly to FIG. 5, in certain embodiments, the feature selection process represented by block 84 of FIG. 4 may include the use of a first feature and a second feature that are mapped to a space, e.g., a two-dimensional plot 88, where each point 90 has coordinates corresponding to the value for the first feature and the value for the second feature. The feature selection process of block 84 may be considered complete when features are found that result in a desired separation between classes of the batteries. As set forth below, more than two features may be utilized resulting in a multi-dimensional plot.

As shown in the plot 88 of FIG. 5, the different categories are represented by different shapes, where the triangles are batteries that passed) the test (a first classification) and the circles are batteries that failed the test (a second classification). The first and second features are selected to allow an optimal separation between the battery classifications, and the feature selection process represented by block 84 of FIG. 4 may utilize battery test SVMs to generate plots similar to the plot 88 depicted in FIG. 5. As shown, the batteries that passed the test are generally located in a first region 92 of the plot, while batteries that failed the test are generally located in a second region 94 of the plot 88 that is separate from the first region 92. The battery test SVMs may calculate a hyperplane 96, which separates batteries that pass the test from those that fail the test using, for example, samples 98 that are relatively close to the frontier between the first and second regions 92, 94.

As generally shown in FIG. 5, the battery test SVMs may calculate the hyperplane 96 by attempting to maximize a margin 99 between the pass and fail classes. Once the hyperplane 96 is constructed, the battery test SVM may be considered to be trained, and therefore becomes a classifier model (e.g., illustrated as a linear or binary classifier model that utilizes a linear separator). However, in another embodiment, the data may be mapped in any finite dimensional space depending on the number of features selected, and, according to such embodiments, the hyperplane 96 calculated by the battery test SVMs may be multi-dimensional (e.g., three dimensions or higher). In accordance with present embodiments, the classification error of the battery test SVMs decreases as more weeks of data are used for predictions. However, again, there may be a balance between the usefulness of a prediction versus its accuracy. The embodiments described herein may achieve such a balance for certain types of tests (e.g., a standardized AK3.4 test) using specially-selected features and when run at different times.

As shown in FIG. 4, the trained battery test SVM 86 (e.g., now a battery test statistical classifier model) may receive and map input data 100 (actual test data from a battery undergoing testing, shown as test data 100) in the space defined by the selected features (e.g., a two or multi-dimensional space, such as plot 88). The test data 100 may include charge and discharge capacity information, as well as the size of the particular battery sample (e.g., H5, H6, according to DIN standards).

In FIG. 5, a data point (e.g., point 101) is predicted to have either a pass status if it falls on what is defined as the passing side of the hyperplane 96 (e.g., within the first region 92), or a fail status if it falls on what is defined as the failing side of the hyperplane 96 (e.g., within the second region 94). The prediction is made with greater confidence as the data point is farther away from the hyperplane 96; i.e., a distance 102 to the hyperplane 96 is large. Further, the prediction has a relatively low confidence factor if the data point is close to the hyperplane 96 (e.g., inside the margin 99). For example, the pass/fail status of the data points 98 each encompassed by a square would be predicted with a relatively lower confidence. Accordingly, each prediction may have a confidence factor that is commensurate with its distance from the hyperplane 96.

Returning again to FIG. 4, the method 80 may include validation (block 104) of the predictive model (e.g., the specially-configured SVM 86). For example, the battery test computer 22 may use the validation module 48 to compare predictions made by the prediction module 46 by determining whether the predictions were accurate. This may result in the production of validation results 106, which may be produced for each prediction made after each test is complete, or may be produced once a plurality of predictions are made and after a plurality of final test results are obtained.

In certain embodiments, the battery test computer 22 may output the validation results 106 to the user. For example, the battery test computer 22 may display the validation results 106 on the display 40. The validation results 106 may include, in certain embodiments, truth tables, accuracy percentage for a plurality of predictions, and so forth.

In certain embodiments, the method 80 involves updating (block 110) training data used in the construction of the model. For example, the battery test computer 22 may use the training module 50 to utilize data collected from more recent runs of the battery test to update the hyperplane 96 generated by the battery test SVM. Once the hyperplane 96 is updated, the statistical model may be considered to be re-trained.

To further illustrate various aspects of the present disclosure, an example implementation is described herein in the context of a battery test prediction for lead-acid AGM batteries undergoing a standardized AK3.4 test. In such embodiments, the AK3.4 test is conducted for 18 weeks total (i.e., the test duration is 18 weeks). The AK3.4 test is an endurance test that helps determine the ability of the AGM lead-acid battery to deliver energy under high cyclic conditions during its lifetime. During these 18 weeks, the particular battery sample is subjected to full and partial charge-discharge cycles. Each week, the discharge and charge capacity is measured. The battery sample passes the test if the discharge capacity, which is normalized by C20 capacity) is greater than a threshold over the 18 weeks. The threshold may be adjusted depending on the desired endurance. For the examples described below, the thresholds were set to 60% and 70% of the battery's C20 capacity at the onset of the test.

In accordance with an embodiment of the present disclosure, the prediction module 46 provides a predictive output at three different time points—a first at 4 weeks, a second at 6 weeks, and a third at 9 weeks according to the method 60 set forth in FIG. 3. Indeed, it has been found that accurate predictions may be provided in as little as 4 weeks for an AK3.4 test when the methods described herein are implemented using appropriate thresholds, features for the battery test SVM models, and so forth. In accordance with one aspect of the present disclosure, first and second features used as inputs to battery test SVM training may be rates of change of discharge and return charge efficiency, which may provide optimal separation between passing and failing batteries for predictive binary classification. However, other features may be used as set forth above.

Figure 6:
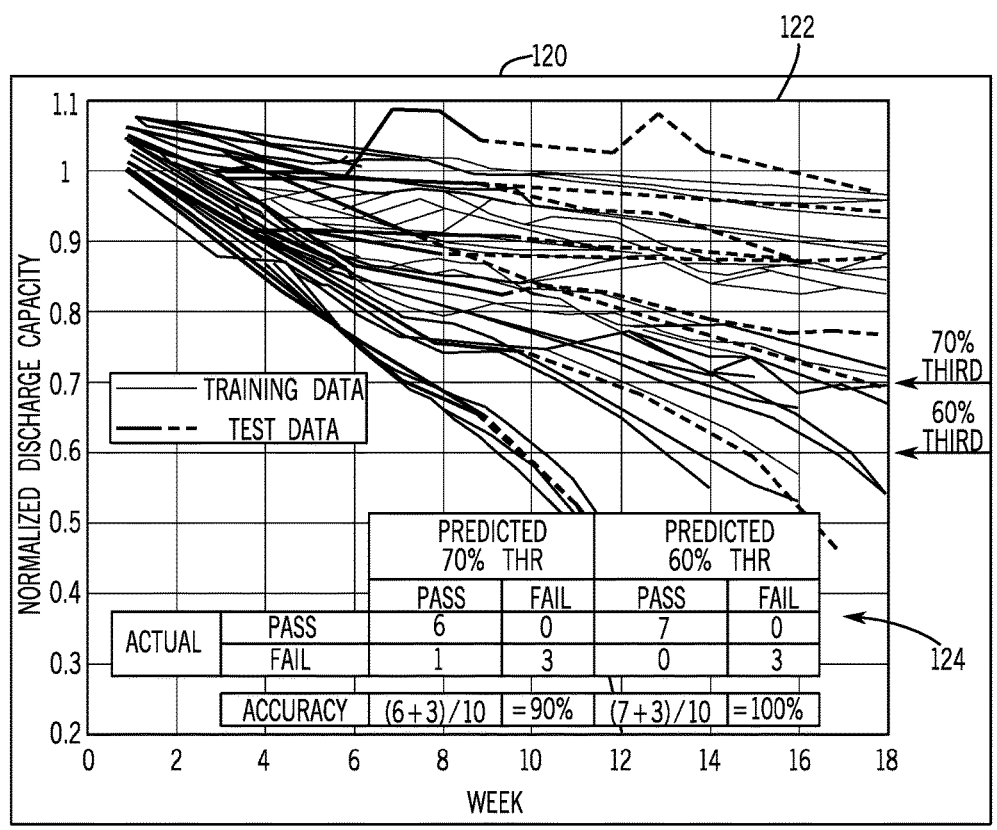
FIG. 6 is an example output generated by the battery test computer of FIG. 2 and including test results, test predictions, and a truth table depicting the accuracy of the predictions, in accordance with an embodiment of the present disclosure.

Actual results from embodiments of the battery test management system 26 implemented in an embodiment of the battery test computer 22 are provided in FIGS. 6 and 7. Specifically, FIG. 6 depicts an output 120 generated by the battery test computer 22 (e.g., an output from the validation module 48). The predictive model (part of the prediction module 46) in this example was constructed using 42 training samples of AGM lead-acid batteries having an H6 standard dimension, and using rates of change of discharge capacity and charge efficiency as the features for the battery test SVM. 10 test batteries (i.e., the batteries for which predictions were provided) were used. The thresholds used were 60% and 70% of each battery's original C20 capacity, and the predictions noted were provided at 9 weeks of test data obtained for the batteries.

The output 120, as shown, includes a plot 122 of normalized discharge capacity as a function of time (in weeks) for the training data and the test data. The output 120 also includes a truth table 124, which illustrates the accuracy of the predictions. As shown, when using a higher threshold (70%), the accuracy was not as high as when the threshold was lower (60%). However, this is not necessarily due to the threshold alone, but due to the incorrectly predicted sample having a normalized discharge capacity close to the 70% threshold. In such embodiments, the prediction module 46 may be updated using the test data obtained for that sample to enhance the accuracy of the model's prediction. In accordance with present embodiments, the batteries predicted to fail may provide useful feedback from a design standpoint for early diagnosis and correction of engineering and/or battery manufacturing issues. Again, this may improve the overall operation of battery engineering processes and may also improve the operation of manufacturing facilities, for example by providing early feedback for quality control.

FIG. 7 depicts an output 130 generated by the battery test computer 22, where the predictive model (part of the prediction module 46) was constructed using 42 training samples of AGM lead-acid batteries having an H7 standard dimension, and using rates of change of discharge capacity and charge efficiency as the features for the battery test SVM. 10 test batteries (i.e., the batteries for which predictions were provided) were used. The thresholds used were 60% and 70% of each battery's original C20 capacity, and the predictions noted were provided at 9 weeks of test data obtained for the batteries.

The output 130 includes a plot 132 of normalized discharge capacity as a function of time (in weeks) for the training data and the test data. The output 120 also includes a truth table 134, which illustrates the accuracy of the predictions. As shown, accurate predictions were output using both the 60% and 70% thresholds. This may be appreciated upon reference to the plots of the test batteries, where the rate of change of the discharge capacity is relatively low.

As set forth above, in a further aspect of the present disclosure, the predictions output by the prediction module 46 may also include predicted battery characteristics. Referring again to the examples set forth in FIGS. 6 and 7, the prediction module 46 may also output (e.g., to the user) a predicted final discharge capacity (e.g., a discharge capacity at the end of the standardized test). FIG. 8 illustrates an example output 140 of final battery discharge capacity.

The output 140 of FIG. 8 includes a plot 142 of final discharge capacity as a function of distance to the hyperplane 96 (see FIG. 5). More specifically, the example distance 102 shown in FIG. 5 from the battery sample's location on the plot 88 to the hyperplane 96 may be used in combination with linear regression to predict the future discharge capacity, as shown in FIG. 8.

The embodiments disclosed herein may be used in any suitable combination, and the present disclosure is intended to encompass any combination of any of the embodiments disclosed herein. As an example, one or more of the disclosed embodiments, in any combination, may be used to provide the technical effect of improving battery testing and manufacturing by predicting battery test results before the tests are concluded. For example, a battery test computer may predict an outcome (e.g., pass/fail) of a battery test being conducted on a battery well before the test would otherwise be complete. The battery test computer may include a tangible, non-transitory computer-readable medium storing a battery test management system implemented as one or more sets of instructions. The battery test management system includes a predictive module configured to predict the battery test result using less than all data required for the battery test to be complete, a validation module configured to validate the prediction, and a training module configured to re-train the predictive module based on results generated by the validation module. Thus, another technical effect may be that the battery test computer provides increasingly accurate predictions by learning from new battery test data. Further, the embodiments set forth herein may be used to update or refine battery designs and manufacturing processes based on early predictions. Accordingly, yet another technical effect of present embodiments may include an improvement to engineering and manufacturing processes associated with battery production. The technical effects and technical problems in the specification are exemplary and are not limiting. It should be noted that the embodiments described in the specification may have other technical effects and can solve other technical problems. For example, battery test SVMs may be constructed and used to generate other predictive outputs for other battery tests such as battery water consumption tests.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A battery testing system, comprising:
a battery test computer comprising a tangible, non-transitory computer-readable medium storing a battery test management system implemented as one or more sets of instructions, wherein the battery test management system comprises a prediction module, a validation module, and a training module, and wherein the battery test computer comprises processing circuitry configured to execute the one or more sets of instructions;
a user interface communicatively coupled to the processing circuitry and configured to provide outputs to a user;
wherein the prediction module is configured predict a result of a standardized battery test conducted on a battery undergoing testing using less than all data required for the standardized battery test conducted on the battery undergoing testing to be completed, and to output, via the user interface, the predicted result and a confidence level associated with the predicted result;
wherein the validation module is configured to determine a validity of the predicted result using final test results from the standardized battery test conducted on the battery, and to output, via the user interface, a representation of the validity;
wherein the training module is configured to update training data using the validity generated by the validation module to update the prediction module;
wherein the prediction module comprises a battery test support vector machine (SVM) constructed using training data obtained from a plurality of battery samples, and the battery test SVM is a binary classification model configured to classify the battery undergoing testing into a pass category or a fail category based on a first feature and a second feature generated from battery test data obtained during the standardized battery test, and wherein the prediction module is configured to output, via the user interface, a plurality of predicted results of the standardized battery test for the battery at time intervals occurring before a full duration of the standardized battery test; and
wherein the standardized battery test simulates the normal operating conditions that would be experienced by the battery undergoing testing over an average lifetime of the particular type of the battery undergoing testing.

2. The battery testing system of claim 1, wherein the battery test computer is configured to:
generate, using the prediction module, a first predicted result of the standardized battery test for the battery undergoing testing at a first time point using test data obtained from the onset of the standardized battery test to the first time point; and
output, via the user interface, the first predicted result in response to determining that the first predicted result has a confidence level above a confidence threshold.

3. The battery testing system of claim 2, wherein the battery test computer is configured to:
generate, using the prediction module, a second predicted result of the standardized battery test for the battery undergoing testing at a second time point occurring after the first time point using test data obtained from the onset of the standardized battery test to the second time point in response to determining that the confidence level of the first predicted result is lower than the confidence threshold; and
output, via the user interface, the second predicted result in response to determining that the second predicted result has a confidence level above the confidence threshold.

4. The battery testing system of claim 3, wherein the first time point is 4 weeks, the second time point is 6 weeks, and the standardized battery test duration is 18 weeks.

5. The battery testing system of claim 1, wherein the first feature is a rate of change of discharge capacity and the second feature is a rate of change of efficiency obtained for the battery undergoing testing during the standardized battery test.

6. The battery testing system of claim 1, wherein the battery test SVM is configured to classify the battery undergoing testing into the pass category or the fail category by constructing a data space in which historical battery test results have been separated into a pass region and a fail region, calculating a hyperplane separating the pass region from the fail region, and mapping battery test data obtained for the battery undergoing testing to the data space to identify a location of the battery test data relative to the hyperplane.

7. The battery testing system of claim 6, wherein the battery test computer is configured to predict, using at least the prediction module, a characteristic of the battery undergoing testing at the end of the standardized battery test using linear regression and a distance from the mapped battery test data obtained for the battery undergoing testing to the hyperplane, and to output the characteristic via the user interface.

8. The battery testing system of claim 7, wherein the characteristic is a final discharge capacity of the battery undergoing testing.

9. The battery testing system of claim 1, wherein the user interface comprises a display configured to output visual representations of outputs from the battery management system to the user.

10. The battery testing system of claim 1, comprising a battery testing apparatus having voltage sensing circuitry, current sensing circuitry, or a combination thereof, and configured to obtain feedback indicative of charge capacity and discharge capacity from the battery undergoing testing.

11. The battery testing system of claim 10, wherein the battery test computer comprises a communication system configured to receive battery test data from the battery testing apparatus.

12. A tangible, non-transitory computer-readable medium storing a battery test management system implemented as one or more sets of instructions, wherein the battery test management system comprises a prediction module, a validation module, and a training module that, when executed by a processor, are configured to:
generate a prediction of a result of a standardized battery test conducted on a battery undergoing testing using less than all data required for the standardized battery test conducted on the battery undergoing testing to be completed, and to output, via the user interface, the prediction of the result and a confidence level associated with the prediction of the result;
determine a validity of the prediction of the result using final test results from the standardized battery test conducted on the battery undergoing testing, and to output, via the user interface, a representation of the validity; and
update training data based on the determined validity to update the prediction module, wherein the prediction module comprises a battery test support vector machine (SVM) constructed using training data obtained from a plurality of battery samples, and the battery test SVM is a binary classification model configured to classify the battery undergoing testing into a pass category or a fail category based on a first feature and a second feature generated from battery test data obtained during the standardized battery test, and wherein the prediction module is configured to generate a plurality of predictions of the result of the standardized battery test for the battery at time intervals occurring before a full duration of the standardized battery test; and
wherein the standardized battery test simulates the normal operating conditions that would be experienced by the battery undergoing testing over an average lifetime of the particular type of the battery undergoing testing.

13. The tangible, non-transitory computer-readable medium of claim 12, wherein the battery test management system is configured to:
generate, using the prediction module, a first prediction of the result of the standardized battery test for the battery undergoing testing at a first time point using test data obtained from the onset of the standardized battery test to the first time point; and
output, via the user interface, the first prediction of the result in response to determining that the first prediction of the result has a confidence level above a confidence threshold.

14. The tangible, non-transitory computer-readable medium of claim 13, wherein the battery test management system is configured to:
generate, using the prediction module, a second prediction of the result of the standardized battery test for the battery undergoing testing at a second time point occurring after the first time point using test data obtained from the onset of the standardized battery test to the second time point in response to determining that the confidence level of the first prediction is lower than a confidence threshold; and
output, via the user interface, the second prediction of the result in response to determining that the second prediction has a confidence level above the confidence threshold.

15. The tangible, non-transitory computer-readable medium of claim 12, wherein the battery test SVM is configured to classify the battery undergoing testing into the pass category or the fail category by constructing a data space in which historical battery test results have been separated into a pass region and a fail region, calculating a hyperplane separating the pass region from the fail region, and mapping battery test data obtained for the battery undergoing testing to the data space to identify a location of the battery test data relative to the hyperplane.

16. The tangible, non-transitory computer-readable medium of claim 15, wherein the battery test management system is configured to predict, using at least the prediction module, a characteristic of the battery undergoing testing at the end of the standardized battery test using linear regression and a distance from the mapped battery test data obtained for the battery undergoing testing to the hyperplane, and to output the characteristic via the user interface.

17. A method of predicting battery test results, comprising:

using a battery test computer to predict a battery test result for a battery undergoing testing, wherein the battery test computer comprises a tangible, non-transitory computer-readable medium storing a battery test management system implemented as one or more sets of instructions, wherein the battery test management system comprises:

a prediction module configured to predict the battery test result using less than all data required for the battery test to be complete, wherein the prediction module comprises a battery test support vector machine (SVM) constructed using training data obtained from a plurality of battery samples, and the battery test SVM is a binary classification model configured to classify the battery undergoing testing into a pass category or a fail category based on a first feature and a second feature generated from battery test data obtained during a standardized battery test;

a validation module configured to validate the prediction; and a training module configured to re-train the predictive module based on results generated by the validation module, and wherein the battery test computer comprises processing circuitry configured to execute the one or more sets of instructions; and outputting, via a user interface, the prediction of the result and a confidence level associated with the prediction, and wherein the prediction module is configured to generate a plurality of predictions of the battery test result for the battery at time intervals occurring before a full duration of the test and wherein the standardized battery test simulates the normal operating conditions that would be experienced by the battery undergoing testing over an average lifetime of the particular type of the battery undergoing testing.

* * * * *